(12) United States Patent
Min et al.

(10) Patent No.: US 7,597,134 B2
(45) Date of Patent: Oct. 6, 2009

(54) HEAT DISSIPATION DEVICE WITH A HEAT PIPE

(75) Inventors: Xu-Xin Min, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/683,373

(22) Filed: Mar. 7, 2007

(65) Prior Publication Data

US 2008/0216990 A1  Sep. 11, 2008

(51) Int. Cl.
*H05K 7/20* (2006.01)

(52) U.S. Cl. .................. 165/80.3; 165/104.33; 361/700

(58) Field of Classification Search ................ 165/80.3, 165/104.33; 361/700
See application file for complete search history.

(56) References Cited

U.S. PATENT DOCUMENTS

| | | | |
|---|---|---|---|
| 6,717,813 B1 | 4/2004 | Garner | |
| 7,100,681 B1* | 9/2006 | Wu et al. | 165/104.33 |
| 7,394,656 B1* | 7/2008 | Huang et al. | 361/700 |
| 2006/0054307 A1* | 3/2006 | Lee et al. | 165/80.3 |
| 2007/0006997 A1* | 1/2007 | Hsieh | 165/104.33 |
| 2007/0097646 A1* | 5/2007 | Peng | 361/701 |
| 2007/0107871 A1* | 5/2007 | Xia et al. | 165/80.3 |
| 2007/0267177 A1* | 11/2007 | Lin et al. | 165/104.21 |
| 2007/0267181 A1* | 11/2007 | Lin et al. | 165/104.33 |
| 2007/0272395 A1* | 11/2007 | Hwang et al. | 165/104.33 |
| 2008/0028610 A1* | 2/2008 | Chen | 29/890.03 |
| 2008/0047693 A1* | 2/2008 | Chen | 165/104.33 |

FOREIGN PATENT DOCUMENTS

| | | |
|---|---|---|
| CN | 2717019 Y | 8/2005 |
| CN | 2762348 Y | 3/2006 |
| CN | 2769980 Y | 4/2006 |
| CN | 2770090 Y | 4/2006 |

* cited by examiner

*Primary Examiner*—Allen J Flanigan
(74) *Attorney, Agent, or Firm*—Frank R. Niranjan

(57) ABSTRACT

A heat dissipation device comprises at least two heat pipes (10) and a plurality of fins (20) thermally connected with the heat pipes (10). Each of the heat pipes (10) comprises a flattened evaporating portion (12) and a condensing portion (14). The evaporating portions (12) are closely connected with each other. A flat bottom surface (125) of the evaporating portions (12) of the heat pipes (10) directly engages with an electronic component. A flat top surface (120) of the evaporating portions (12) of the heat pipes (10) directly engages with a bottom surface of the fins (20). The condensing portions (14) of the heat pipes (10) extend through the fins (20).

2 Claims, 4 Drawing Sheets

HEAT DISSIPATION DEVICE WITH A HEAT PIPE

BACKGROUND OF THE INVENTION

1. Field of the Invention

The present invention generally relates to heat dissipation devices, and more particularly to a heat dissipation device having a heat pipe for cooling an electronic component, such as an integrated circuit package.

2. Description of Related Art

Electronic components, such as central processing units (CPUs) comprise numerous circuits operating at high speed and generating substantial heat. Under most circumstances, it is necessary to cool the CPUs in order to maintain safe operating conditions and assure that the CPUs function properly and reliably. In the past, various approaches have been used to cool electronic components. Typically, a finned metal heat sink is attached to an outer surface of the CPU to remove the heat therefrom. The heat absorbed by the heat sink is then dissipated to ambient air. The related finned metal heat sink is made of highly heat-conductive metal, such as copper or aluminum, and generally comprises a solid metal base for contacting with the CPU to absorb the heat therefrom and a plurality of fins formed on the base for dissipating the heat. However, as the operating speed of electronic components has increased markedly in recent years, heat sinks which transfer the heat only by metal conduction are insufficient for this purpose and as a result the heat from the bottom of the metal heat sink cannot be transferred to the whole heat dissipation device quickly enough.

Heat pipes, which operate by phase change of working liquid sealed in a hollow pipe have been widely used due to their excellent heat transfer properties. Accordingly, heat dissipation devices equipped with heat pipes are widely used. U.S. Pat. No. 6,163,073 shows an integrated heat sink with heat pipes. The heat sink has a cast base plate and vertically extending fins, the fins being cast integrally with the base plate. The base plate has elongated grooves that extend along a bottom of the base plate. Elongated heat pipes are disposed in the elongated grooves for contacting with heat sink and the CPU. The related art indicates that this structure reduces thermal gradients in the heat sink. However, the area of the base in contact with the CPU is greater than the area of the heat pipe in contact with the CPU. The heat of the base of the heat sink still cannot be transferred to the whole heat sink quickly enough.

Another technique for dissipating heat includes a base including an envelope filled with working liquid (i.e. vapor chamber). This kind of heat dissipation device includes a heat sink in contact with the base. The working fluid circulates between a liquid phase and a gaseous phase in the vapor chamber in such a manner that heat is taken up at a point that is in contact with the CPU, and the heat is released at a point in contact with a heat sink. This structure has better heat dissipation, but it is complex and expensive.

Accordingly, what is needed is a heat dissipation device with heat pipes which has an enhanced heat dissipation performance and inexpensive.

SUMMARY OF THE INVENTION

According to an embodiment of the present invention, a heat dissipation device comprises at least two heat pipes and a plurality of fins thermally connected with the heat pipes. Each of the heat pipes comprises a flattened evaporating portion and a condensing portion. The evaporating portions are closely connected with each other. A flat bottom surface of the evaporating portions of the heat pipes directly engages with an electronic component. A flat top surface of the evaporating portions of the heat pipes directly engages with a bottom surface of the fins. The condensing portions of the heat pipes extending through the fins.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

Other advantages and novel features will become more apparent from the following detailed description of preferred embodiment when taken in conjunction with the accompanying drawings, in which.

DETAILED DESCRIPTION OF THE INVENTION

Figure 1:
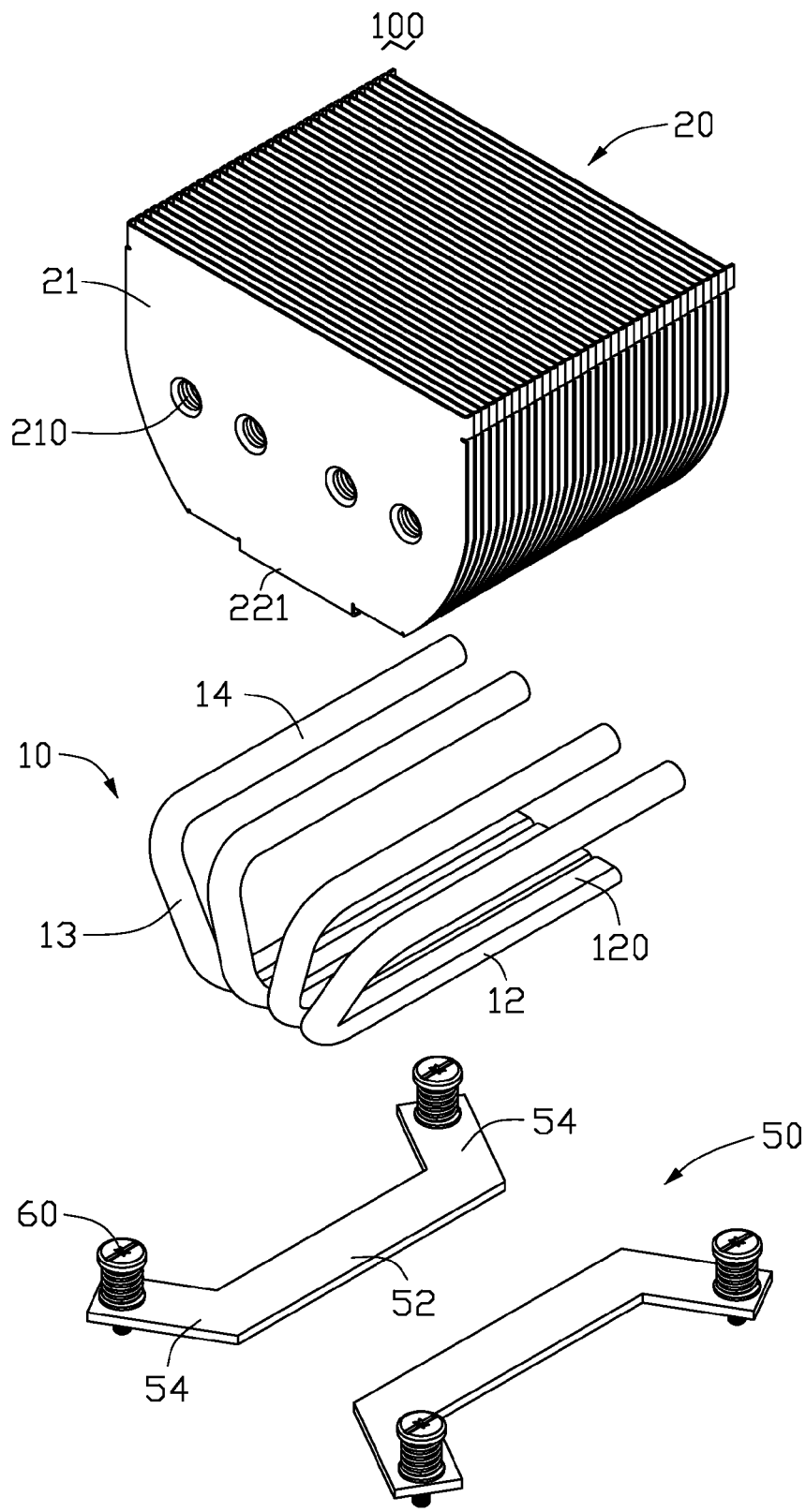
FIG. 1 is an exploded, isometric view of a heat dissipation device in accordance with a preferred embodiment of the present invention.
Figure 2:
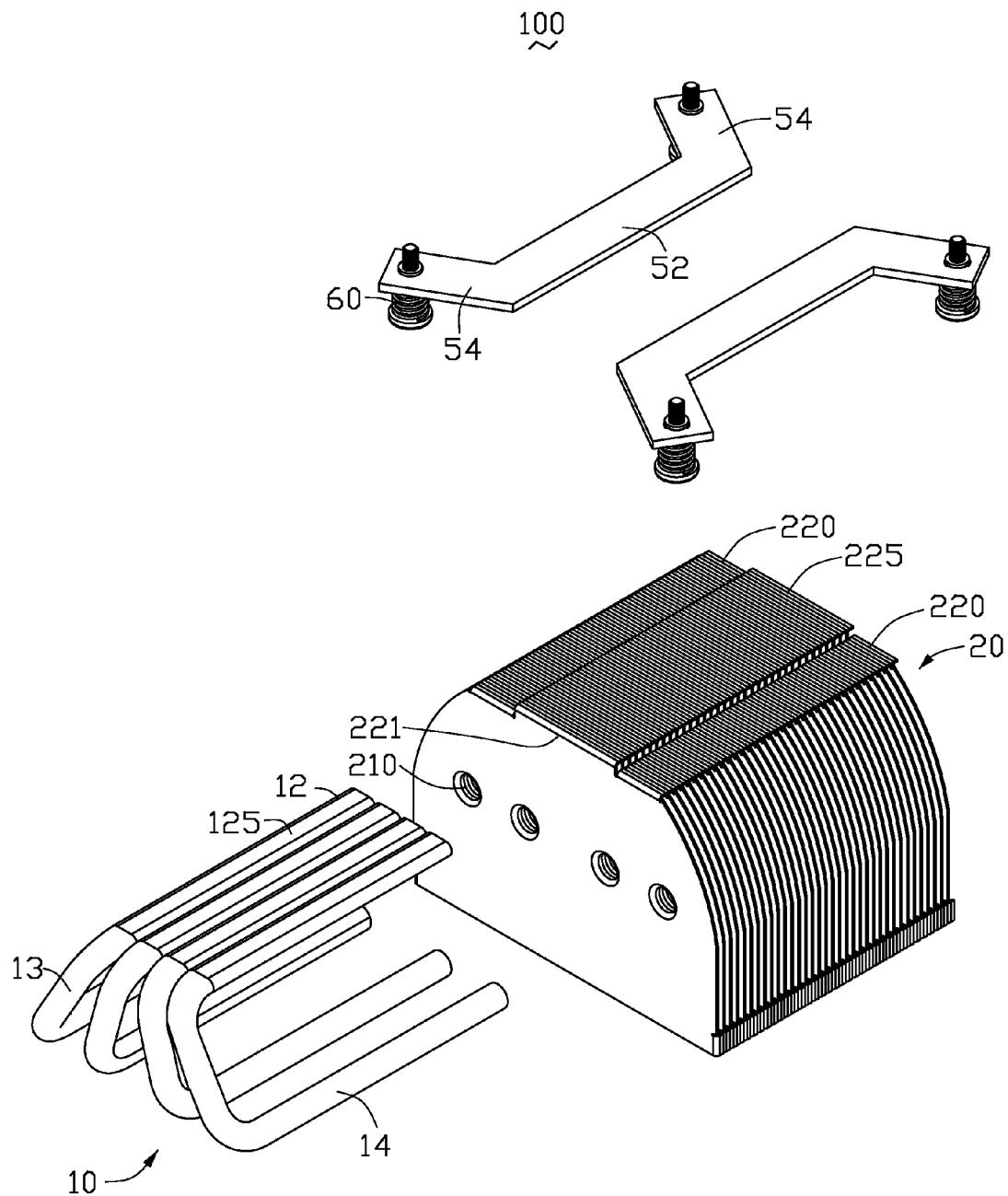
FIG. 2 is an inverted view of FIG. 1.
Figure 3:
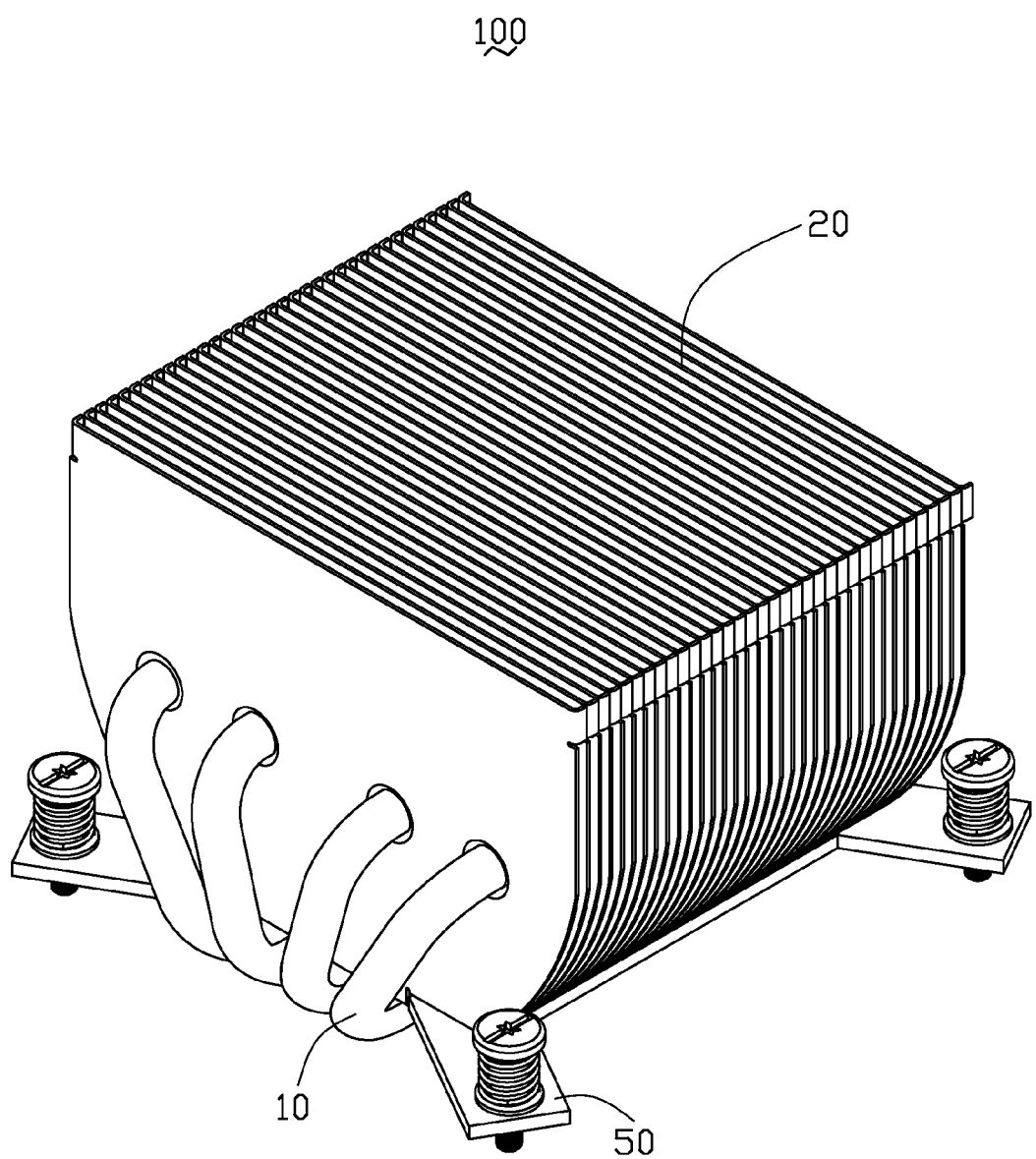
FIG. 3 is an assembled view of FIG. 1.
Figure 4:
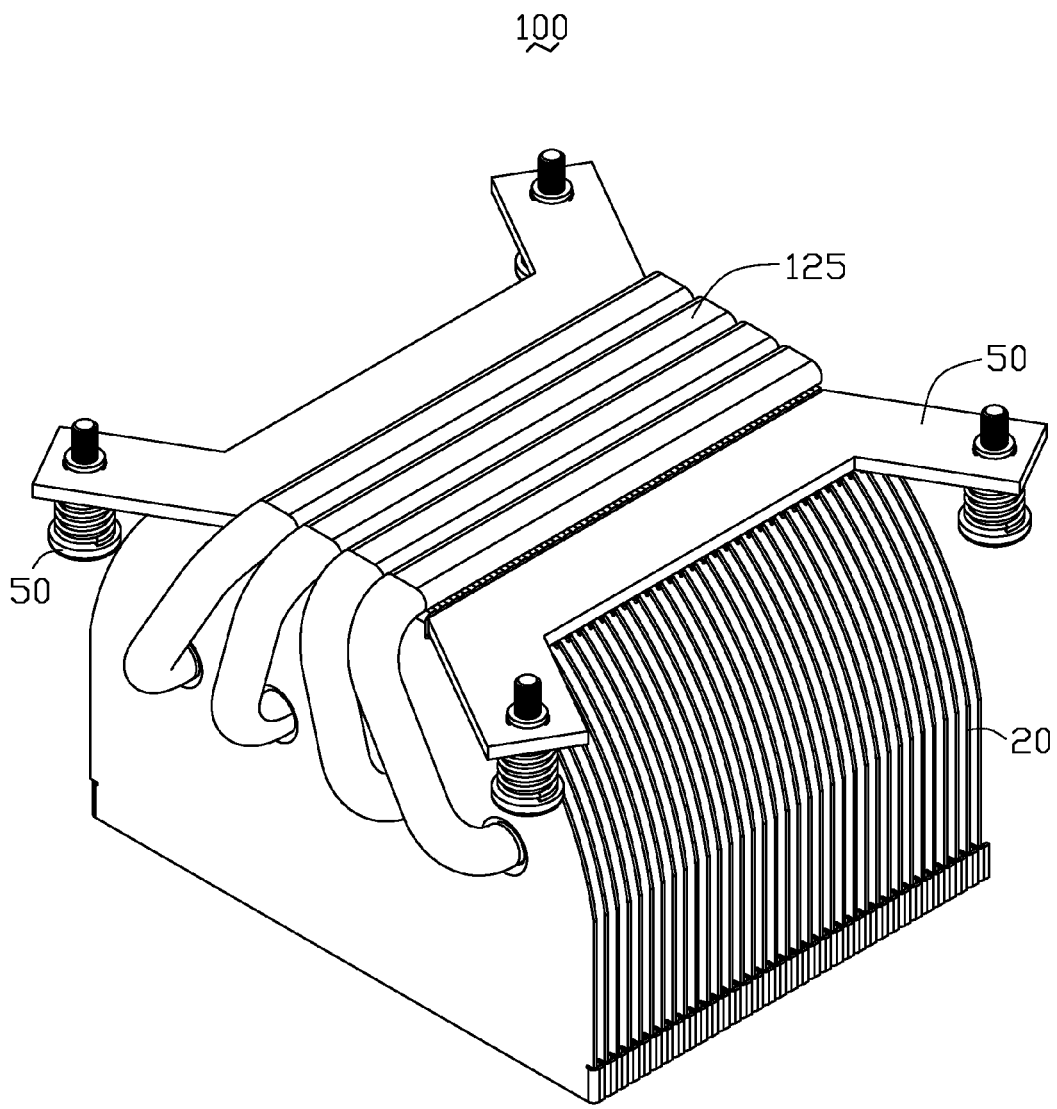
FIG. 4 is an assembled view of FIG. 2.

Referring to FIG. 1 and FIG. 4, a heat dissipation device 100 in accordance with a preferred embodiment of the present invention is shown. The heat dissipation device 100 can be mounted to a printed circuit board (not shown) to remove heat from a heat-generating electronic device (not shown) mounted on the printed circuit board, such as a CPU (not shown). The heat dissipation device 100 comprises a plurality of fins 20 and four heat pipes 10 connecting the CPU and the fins 20. The heat dissipation device 100 further comprises two locking members 50 soldered to two opposite bottom sides of the fins 20 to secure the heat dissipation device 100 to the printed circuit board.

The heat pipes 10 are U-shaped. Each heat pipe 10 comprises a horizontal evaporating portion 12, a condensing portion 14 parallel to the evaporating portion 12 and an adiabatic portion 13, connecting the evaporating portion 12 and the condensing portion 14. The evaporating portions 12 of the heat pipes 10 are flattened, which means that their bottom surface 125 and top surface 120 are both flat and coplanar. The evaporating portions 12 of the heat pipes 10 are closely connected with each other, without a significant gap therebetween. Thus, the evaporating portions 12 act as a base for directly contacting with a top surface of the CPU and a bottom surface of the fins 20. The condensing portions 14 of the heat pipes 10 spread out and extend through the fins 20.

The fins 20 are oriented perpendicular to the evaporating portions 12 of the heat pipes 10 and parallel to each other. The fins 20 each comprise a thin sheet metal plate 21 which has a U-shaped configuration. A central portion of the bottom surface of the fins 20 protrudes perpendicularly and downwardly a protrusion 221 such that a pair of receiving spaces (not labeled) are symmetrically formed at flanks of the protrusion 221 for receiving the corresponding locking members 50 therein. Flanges 220, 225 are bent from the bottom surface of the fins 20. The flanges 225 are engaged with the top surface 120 of the evaporating portions 12 of the heat pipes 10 and the other flanges 220 located at flanks of the flanges 225 are engaged with the locking members 50. The top surface 120 of the evaporating portions 12 of the heat pipes 10 is soldered on the flanges 225. The flanges 220, 225 separate the fins 20 at uniform intervals. The fins 20 define holes 210 in the plates 21 to define channels (not labeled) for receiving the condensing portions 14 of the heat pipes 10.

Each locking member 50 comprises a locking beam 52 soldered to the corresponding flanges 220 of the fins 20 and two legs 54 extending outwardly from opposite ends of the locking beam 52 at an angle to the locking beam 52. The legs 54 define apertures therein for extending screws 60 therethrough to engage with a retainer (not shown), thereby mounting the heat dissipation device 100 to the printed circuit board.

When the heat dissipation device 100 is used, the base formed by the evaporating portions 12 of the heat pipes 10 is disposed on the top surface of the CPU. Heat generated by the CPU is conducted to the evaporating portions 12 via the bottom surface 125. Then a part of the heat accumulated on the evaporating portions 12 is transferred to the fins 20 via the adiabatic portions 13 and the condensing portions 14 of the heat pipes 10. Another part of the heat accumulated on the evaporating portions 12 is directly transferred to the fins 20 via the top surface 120 of the evaporating portions 12. Finally, the heat is dissipated to surrounding air by the fins 20.

The flattened evaporating portions 12 of the heat pipes 10 act as the base to have a large area contact with the CPU to absorb heat therefrom; thus, the heat dissipation device 100 can efficiently absorb the heat and dissipate the heat of the CPU. The heat dissipation efficiency of the heat dissipation device 100 can be improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   at least two heat pipes each comprising a flattened evaporating portion and a condensing portion, the evaporating portions closely connected with each other;
   a plurality of fins thermally connected with the heat pipes and having a bottom surface defining a middle protrusion and a pair of receiving spaces at flanks of the middle protrusion, the condensing portions of the heat pipes extending through the fins; and
   two locking members located at two lateral sides of the evaporating portions of the heat pipes, respectively, each of the locking members having a locking beam which is received in a corresponding receiving space and soldered to the bottom surface of the fins and juxtaposed to a corresponding lateral side of the evaporating portions of the heat pipes and two legs extending outwardly from opposite ends of the locking beam at an angle to the locking beam;
   wherein a flat bottom surface of the evaporating portions of the heat pipes is adapted for directly engaging with an electronic component;
   wherein the fins each form a flange perpendicularly extending from a bottom edge thereof; and
   wherein the flanges of the fins form a planar surface at a bottom of the middle protrusion of the fins for contacting with the evaporating portions of the heat pipes;
   wherein the evaporating portions of the heat pipes are wholly located at an underside of the planar surface formed by the flanges of the fins and have a flat top surface directly attached to the planar surface formed by the flanges of the fins.

2. The heat dissipation device as described in claim 1, wherein the condensing portions of the heat pipes are spaced from each other and level with each other.

* * * * *